United States Patent [19]

Willenbecher, Jr.

[11] 4,090,130

[45] May 16, 1978

[54] CAPACITIVE COUPLED CLAMP-ON VOLTAGE PROBE

[75] Inventor: James F. Willenbecher, Jr., East Windsor, Conn.

[73] Assignee: United Technologies Corporation, Hartford, Conn.

[21] Appl. No.: 747,756

[22] Filed: Dec. 6, 1976

[51] Int. Cl.² .................... G01R 15/04; H01G 3/00
[52] U.S. Cl. ................................. 324/126; 361/302
[58] Field of Search .............. 324/126, 127, 15, 129; 361/302

[56] References Cited

U.S. PATENT DOCUMENTS

| | | | |
|---|---|---|---|
| 1,981,716 | 11/1934 | Austin | 324/126 |
| 2,760,157 | 8/1956 | Dexter | 324/126 |
| 3,396,339 | 8/1968 | Miram | 324/126 |
| 3,477,024 | 11/1969 | Pelta | 324/126 |

*Primary Examiner*—Rudolph V. Rolinec
*Assistant Examiner*—Ernest F. Karlsen
*Attorney, Agent, or Firm*—Donald F. Bradley

[57] ABSTRACT

A capacitive coupled clamp-on voltage probe having three concentric cylindrical capacitive plates each separated by a thin dielectric is adapted to be clamped onto an insulated wire such as the ignition wire in an automobile to measure the potential of the wire. In one embodiment the probe contains a solid dielectric center with a slot along its longitudinal axis which extends radially from the outside to the center of the probe thereby allowing the probe to be easily positioned over and released from an automobile ignition wire by slipping the probe over any insulated portion of the wire. The slot is dimensioned to hold the wire securely at the center of the probe. The probe also includes a releasable clamp having a thumb actuated lever to assist in maintaining the wire securely at the probe center and to permit easy positioning and release of the wire. In a second embodiment the probe is separated into two symmetrical semicylindrical halves which open and close by a spring loaded lever to admit the wire whose potential is to be measured.

2 Claims, 8 Drawing Figures

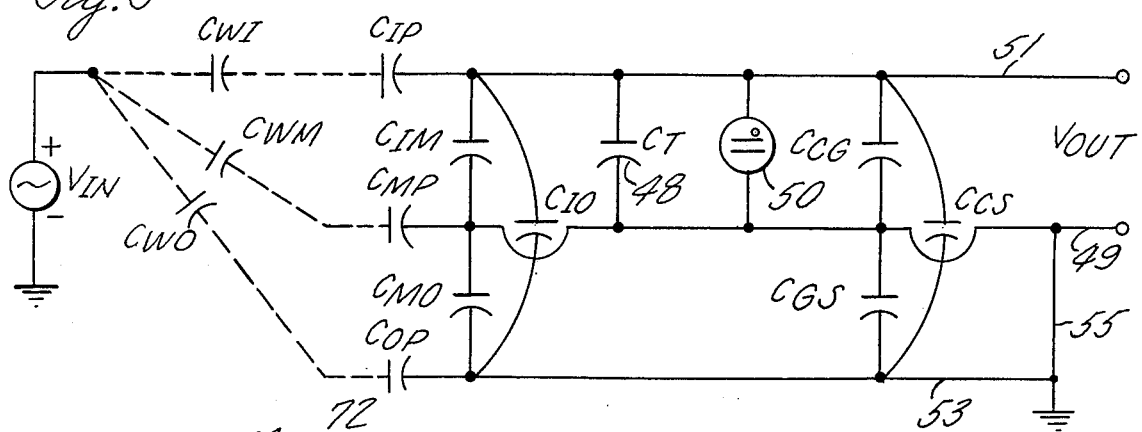
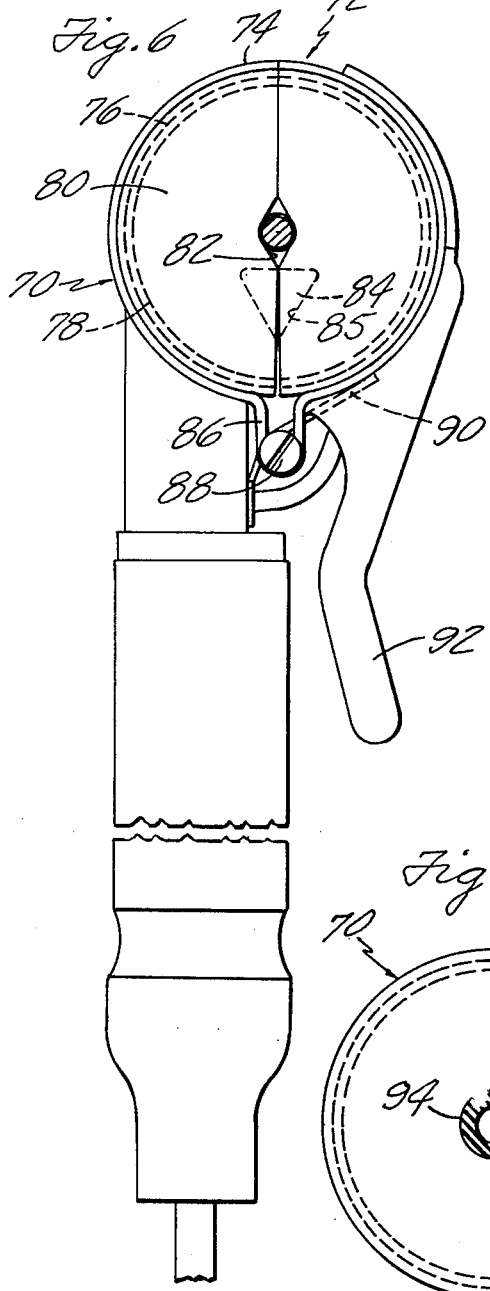
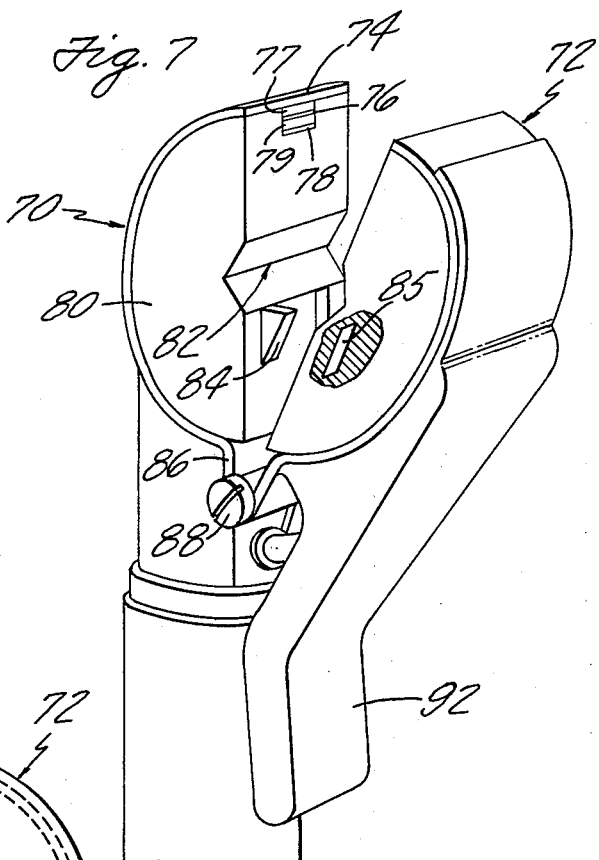
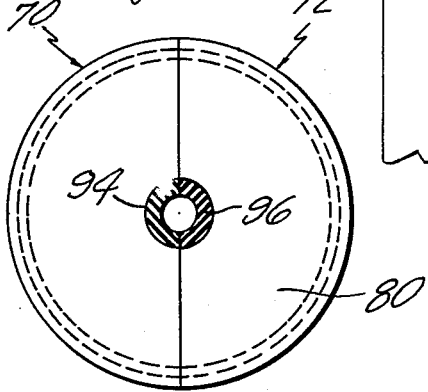

CAPACITIVE COUPLED CLAMP-ON VOLTAGE PROBE

BACKGROUND OF THE INVENTION

1. Field of the Invention

This invention relates to a clamp-on voltage probe which is adapted to measure the amplitude of voltage pulses within the ignition wire of an automobile. As a result of the novel features of the clamp-on voltage probe, the accuracy of the voltage measurement is improved by 300 percent or more over prior art voltage probes. The clamp-on voltage probe is quickly attached over and detached from the insulated ignition wire of an automobile without disturbing the wire and also without disturbing the electrical characteristics of the ignition system.

2. Description of the Prior Art

Prior art voltage probes which are used to measure the ignition pulses in automotive systems suffer from many defects. Some probes are adapted to be connected in line with the ignition wire and require the ignition wire to be removed from the ignition system in order to connect the probe. These probes, although satisfactory for some applications, alter the electrical characteristics of the system and tend to change some fault symptoms. For example, an ignition wire termination which is faulty could be damaged when inserting the in-line probe so as to require repair of the connection and removal of the fault before diagnosis. Also, an undamaged ignition wire could be damaged when inserting the in-line probe.

Prior art clamp-on probes suffer from defects such as minimum dielectric thickness which result in probe dielectric breakdown and probe inaccuracy. Also the clamp-on probes which are commercially available do not accurately position the ignition wire with respect to the probe pickoff plates, resulting in inaccuracies in the voltage measurement.

In order to construct an improved voltage probe which will accurately measure the voltage in an insulated wire without disconnecting the wire, it is necessary to overcome two variables which result in inaccuracies, namely, the dielectric change in the insulation of the wire from wire to wire, and the changes in diameter and shape which commonly occur along the length of the wire. The change in wire dielectric may be overcome by providing a low pickoff plate capacitance which is much less than the wire capacitance and which will effectively reduce or cancel out variations in the dielectric capacitance of the ignition wire. The changes in wire diameter can be controlled by making the radius of the voltage probe much greater than the radius of the wire. An additional error in the voltage measurement may be induced by electrical fields created by the wire itself or by other wires in the locality which produce their own electrical fields thus charging up the capacitance plate by other means than the coupling between the wire whose voltage is being measured and the capacitive plate. This latter problem may be overcome by shielding of the capacitive plate.

The present invention overcomes deficiencies in the prior art voltage probes and provides improved accuracy by means of its unique mechanical and electrical design. In one embodiment, the probe is specifically adapted for use with automobile ignition wires, that is, 7 millimeter wire, while in a second embodiment the probe is adapted for use with wires of varying diameter. The voltage probe produces its improved accuracy by using three concentric cylindrical pickoff plates to which are connected a twisted shielded pair transmission wire. In both embodiments the probe is designed to maintain the ignition wire securely at the center of the probe and concentric with the pickoff plates.

SUMMARY OF THE INVENTION

It is an object of the present invention to provide a capacitive coupled clamp-on voltage probe for measuring the amplitude of voltage pulses in insulated wires, particularly in the ignition system of motor vehicles.

Another object of the present invention is a voltage probe which easily attaches to and releases from an ignition wire by slipping over any insulated portion of the wire, correctly positions the wire at the probe center, and then releases the wire with a clamp thumb release lever.

A further object of the present invention is a capacitive voltage probe having a concentric three plate pickoff and shield design to maximize accuracy and minimize noise.

A still further object of the present invention is a clamp-on voltage probe which reduces damage to automotive ignition circuits.

In accordance with one embodiment of the invention, the capacitive clamp-on voltage probe consists of a cylindrical head which contains a solid dielectric center having a radially extending slot through which the ignition wire to be tested slides, and which aligns the wire along the center of the probe during voltage measurement. The probe head consists of three concentric pickoff plates separated by a dielectric, the three pickoff plates forming a three plate capacitor. The outer plate has a thickness sufficient to provide structural rigidity to the probe. A spring loaded wire clamp is positioned at the flat end surfaces of the cylindrical probe to hold the ignition wire stationary at the center of the probe while measurements are being made. The wire clamp also serves to maintain the ignition wire in the same position relative to the probe each time a measurement is taken thereby assuring repeatability of the measurements. The voltage measured by the pickoff plates is fed through a shielded twisted wire transmission cable which passes through a handle connected to the outer shell of the probe.

In an alternative embodiment, the probe is split into two symmetrical halves which are hinged to allow the halves to open and close in clamshell fashion to admit the ignition wire. In this embodiment the solid dielectric center may include diamond shaped self-centering grooves which hold the ignition wire in place, or may include semicircular grooves in each half in which a compressible rubber sheeting is mounted to accommodate ignition wires of various sizes and to eliminate air gaps. The probes of both embodiments operate electrically in a substantially similar manner.

BRIEF DESCRIPTION OF THE DRAWINGS

FIG. 5 is a circuit schematic showing the electrical characteristics of the voltage probe.

FIG. 6 is a side elevation of a second embodiment of the voltage probe.

FIG. 7 is a perspective view of the embodiment of FIG. 6.

FIG. 8 is a side elevation of a modification of the second embodiment shown in FIGS. 6 and 7.

DESCRIPTION OF THE PREFERRED EMBODIMENT

Figure 1:
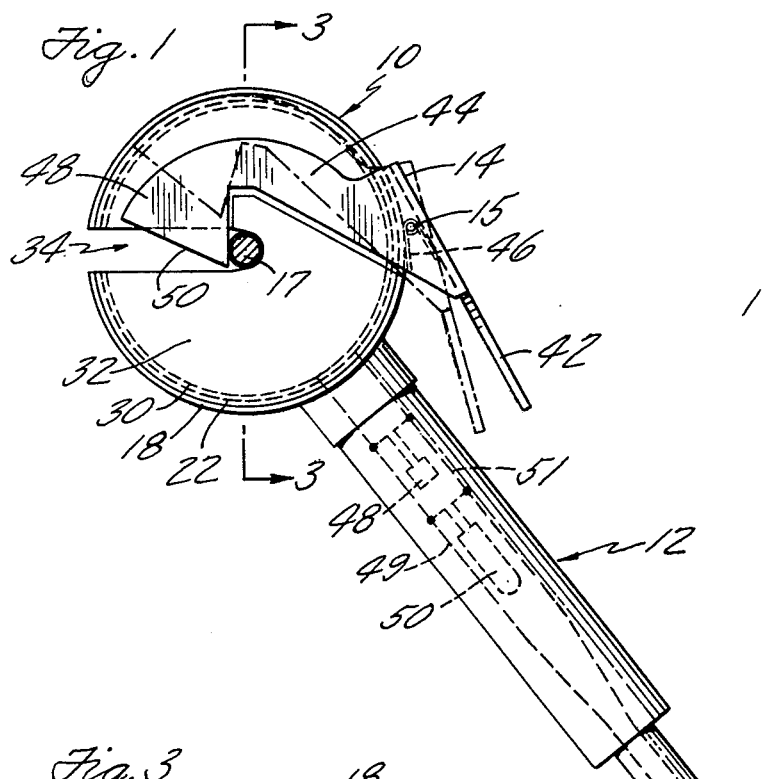
FIG. 1 is a side elevation of one embodiment of the clamp-on voltage probe.

The prior art voltage probes, although sufficiently accurate in some applications, are not feasible for measurement of the high voltages in automotive ignition systems due to various sources of error not generally found in other applications. The major sources of error include changes in the dielectric constant of the ignition wire insulation which result in a range of ignition wire capacitances about the nominal capacitance, changes in ignition wire diameter and shape which result in changes in wire position inside the probe and changes in ignition wire-probe series capacitance, squeezing of the ignition wire by the clamping action of the probe resulting in variations of the wire capacitance, proximity of the ignition wire to the probe pickoff plates which causes breakdown of the probe pickoff voltage, proximity of the probe to an ignition wire termination which results in a variation in the probe pickoff voltage, and variation of the wire attitude inside the probe which results in a variation in the probe output voltage.

The present invention eliminates or reduces the above sources of error, and provides a voltage probe which will measure high voltage ignition pulses in a motor vehicle with high accuracy and without removing the ignition wire.

Changes in ignition wire capacitance due to variation in the wire dielectric constant are minimized by providing a characteristic probe pickoff capacitance which is much less than the characteristic ignition wire capacitance, i.e., the capacitance between the ignition wire and its insulation is much greater than the capacitance between the outer surface of the insulation of the ignition wire and the inner plate of the probe. Changes in the series combination of ignition wire capacitance and probe capacitance due to variations in the ignition wire diameter and shape are minimized by always positioning the ignition wire as close to the probe center as possible. Clamping the ignition wire at the center of a clamshell probe or at the end of a slot in the solid center of the probe restricts all motion and centers the position of the ignition wire in the probe, limiting probe error to that induced by changes in wire diameter. Variation in ignition wire capacitance due to squeezing of the wire is minimized by making the probe clamp of sufficient strength to only clamp the wire gently and in a noncritical dimensional area. Breakdown of the probe dielectric material due to proximity of the pickoff plate to the ignition wire is minimized by providing a thick dielectric material between the pickoff plate and the ignition wire. Variations in probe pickoff voltage are minimized by preferably positioning the probe two inches or more from the ends of the ignition wire wherever possible. Variation in the probe pickoff signal due to variation in ignition wire attitude within the probe is minimized by restricting all motion of the ignition wire when the wire is clamped in the probe.

Improved operation is also provided by making the radius between the conducting ignition wire and the outer surface of its insulation much less than the radius between the conducting wire and the inner pickup probe plate, more specifically, the inner pickup probe plate has a radius at least four times the radius of the insulated wire. The inner pickup probe plate itself is effectively shielded from outside electrical signals. This may be accomplished by completely covering the inner pickup probe plate with a first shield and effectively connecting the shield to a reference. However, in practice, and particularly when used with automobile ignition systems, the shield cannot be effectively grounded and is subject to the buildup of charges due to lead impedance and other outside signal sources. In order to overcome this problem, a second shield may be put on the outside of the voltage probe. If the first shield is now tied to the reference, the changes in external fields relative to the probe will be limited by the second shield and the first shield. In effect, the voltage measurement is made between the inner pickup probe plate and the first shield with most of the electrical interference being removed by the second shield.

Figure 2:
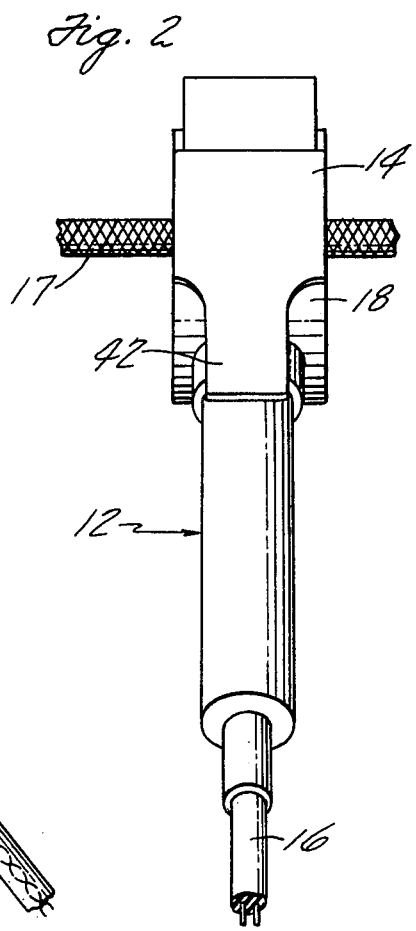
FIG. 2 is a rear elevation of the clamp-on voltage probe of FIG. 1.
Figure 3:
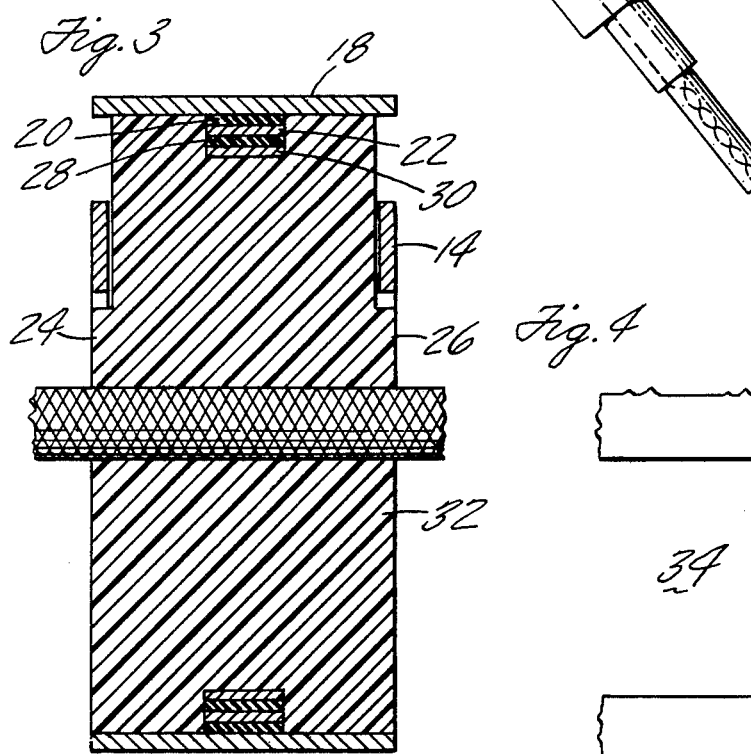
FIG. 3 is a cross section of the voltage probe as shown by lines 3—3 of FIG. 1.

Referring particularly to FIGS. 1-3, there is shown the clamp-on voltage probe of this invention. The probe consists of a cylindrical probe head 10 to which is connected a tubular handle portion 12. A spring loaded wire clamp 14 is attached to the probe head and pivots about a rod 15, displacement of the clamp 14 allowing the ignition wire 17 to be positioned at the center of the probe head 10. A signal transmission cable 16 is connected at one end to the probe pickup and shield plates 30, 22 and 18 to be described subsequently, the cable 16 passing through the handle 12 to transmit the ignition wire voltage to a voltage measuring device, not shown.

The probe head 10 consists of a shell 18 of cylindrical copper tubing approximately two inches in diameter, one inch wide and 1/16 inch thick. Layers of dielectric fiber glass tape 20 (FIG. 3) having a total thickness of about 0.012 inch are adhesively attached to the inside of the probe shell 18. A copper foil 22 which is approximately 0.004 inch thick is adhesively attached to the inside of the dielectric fiber glass tape 20. As seen best in FIG. 3, the copper foil 22 is 3/16 inch wide and positioned symmetrically between the outside edges 24 and 26 of the probe shell 18. A second group of layers of dielectric fiber glass tape 28 having a total thickness of about 0.042 inch is adhesively attached to the inside of copper foil 22. Adhesively attached to the inside of the dielectric tape 28 is a second copper foil 30, which is 3/16 inch wide and 0.004 inch thick. The foils 22 and 30 are shown by dotted lines in FIG. 1, while the tapes 20 and 28 are not shown in FIG. 1. Foils 22 and 30 are made narrower than probe shell 18 to reduce the probe pickoff plate capacitance to a minimum value as will be explained subsequently.

Figure 4:
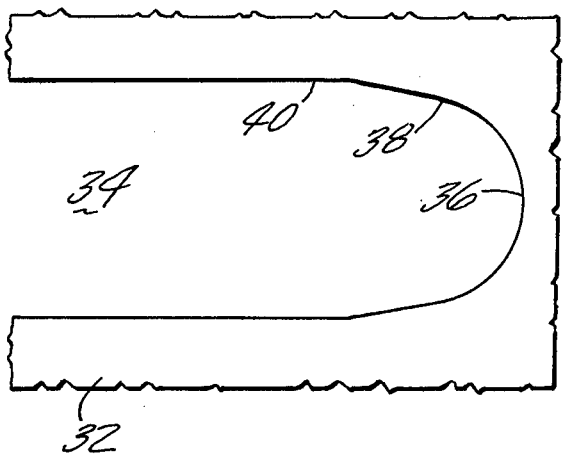
FIG. 4 is an enlarged view of a portion of the voltage probe of FIGS. 1-3 showing the details of the probe center slot.

A low dielectric constant, high temperature silicon RTV compound 32 is inserted in the center of the probe such as by pouring and curing in a mold. A slot 34 approximately 5/16 inch wide is cut radially from the outside of the probe head 10 to the center thereof. As seen best in FIG. 4, the inner end 36 of the slot is semicircular and has a radius of approximately 0.140 inch in order to conform the end of the slot 34 to the shape of the ignition wire of approximate radius of 0.1375 inch whose voltage is to be measured. The slot 34 expands tangentially from its semicircular end 36 to a width of 5/16 inch by a straight connecting portion 38 which is at an angle of approximately 15° from the parallel slot sides, i.e., the angle 40 is approximately 165°.

The spring loaded wire clamp 14 includes a longitudinally extending thumb lever portion 42 and a clamping member 44. The spring loaded wire clamp 14 rotates about the pivot rod 15 which consists of a length of formed steel wire attached to the outer surface of the probe shell 18 such as by soldering or brazing. As seen best in FIG. 1, a spring 46 which is positioned on the pivot rod 15 before brazing thereof serves to return the spring loaded wire clamp 14 to a closed position. The end of the clamping member 44 is formed into a positioning strut 48 which embraces the ignition wire when the spring loaded wire clamp 14 is in its closed position. The positioning strut 48 also serves to maintain the ignition wire in a longitudinally straight position at the inner end 36 of the semicircular slot 34. By depressing the thumb lever portion 42 of the spring loaded wire clamp the positioning strut 48 is raised as shown in phantom (FIG. 1) to allow easy removal of the ignition wire through the slot 34.

A novel feature of the spring loaded wire clamp 14 is the design of the outer portion of the clamping member 44 which is shown as a cam surface 50. The cam surface serves to open the spring loaded wire clamp automatically when an ignition wire is forced against it. By virtue of the spring 46 being in compression, the spring loaded wire clamp 14 will automatically close when the ignition wire 17 reaches its final position at the center of the probe head.

Handle 12 consists preferably of ½ inch copper tubing which is connected to the outside surface of the probe shell 18 such as by brazing. The transmission signal cable 16 passes through the center of the handle member 12 and is connected at one end to the three capacitive plates consisting of shell 18 and foils 22 and 30 of the probe head 10. The transmission signal cable 16 preferably consists of a twisted shielded pair cable with the shield 53 (see FIG. 5) being connected to the handle which is in turn electrically in contact with the shell 18, and the twisted pair shown as wires 49 and 51 being connected respectively to the two foil pickoff plates 22 and 30.

As shown schematically in FIG. 1, a trim capacitor 48 and an arcover protection device such as a neon bulb 50 are connected across the twisted pair wires 49 and 51 of the transmission cable.

The voltage probe uses the characteristic capacitance of the ignition wire whose voltage is to be measured and the capacitance of the inner foil pickoff plate 30 and dielectric RTV compount 32 in a series connected circuit to measure the voltage on the ignition wire.

Typical ignition wires used in automobiles vary in characteristic capacitance between 25 and 50 picofarads per foot. This difference in wire capacitance has heretofore caused errors in the measurement of the voltage within the ignition wire. By using the 3/16 inch wide foil pickoff plates 22 and 30, the variation in the ignition wire characteristic capacitance is effectively reduced or canceled out. This is accomplished by designing the capacitance of the foil pickoff plate 30 and dielectric RTV compound 32 to be much less than the ignition wire capacitance more specifically, the capacitance between the pickoff plate 30 and the wire insulation is no more than one-third the capacitance between the wire insulation and the conducting wire 17.

FIG. 5 shows an electrical circuit schematic depicting the operation of the clamp-on probe. Referring to FIG. 5, voltage generator $V_{IN}$ represents the ignition system voltage source, typically the ignition coil in an automobile. Capacitances $C_{WI}$, $C_{WM}$ and $C_{WO}$ represent respectively the capacitances of the ignition wire 17 as seen by the inner, middle and outer probe pickoff plates 30, 22 and 18 respectively. Capacitances $C_{IP}$, $C_{MP}$ and $C_{OP}$ represent the capacitances of the probe pickoff plates 30, 22 and 18 respectively as seen by the ignition wire. These capacitances connect as shown in FIG. 5.

Capacitance $C_{IM}$ represents the capacitance between the inner and middle pickoff plates 30 and 22. Capacitance $C_{MO}$ represents the capacitance between the middle and outer plates 22 and 18. Capacitance $C_{IO}$ represents the capacitance between the inner and outer plates 30 and 18.

Capacitance $C_T$ is the trim capacitor 48 as shown also in FIG. 1. Although represented as one capacitor, the capacitance $C_T$ may physically be two or more capacitors, and may be variable. Also shown in FIG. 5 is the over-voltage protection neon bulb 50.

Capacitances $C_{CG}$, $C_{GS}$ and $C_{CS}$ are the characteristic impedances of the transmission signal cable, respectively, wire 51 to wire 49, wire 49 to the shield 53, and wire 51 to the shield 53. The output voltage $V_{OUT}$ is transmitted from the two twisted wires 49 and 51 to a voltage measurement device. The transmission wire 49 which is connected to the middle pickoff plate 22 is also connected to the cable shield 53 as shown by connecting wire 55 at the cable connector which plugs into the voltage measuring device. When the connection 55 is made between transmission wire 49 and cable shield 53, capacitances $C_{MO}$ and $C_{GS}$ reduce effectively to zero.

The pickoff plates 18, 22 and 30 are designed to provide a 3,000 to 1 voltage attenuation ratio in conjunction with the use of the characteristic capacitance of the signal transmission cable 16 and without any trim capacitor 48. By adding trim capacitor 48 of approximately 1,000 picofarads the voltage attenuation ratio becomes approximately 5,000 to 1.

In tests of the clamp-on probe described herein it has been found that the error of voltage measurement is 3 percent or less for the temperature range 0° to 65° C and for three different types of ignition wire. The measurement made by the probe will also take into account the variations in thickness of ignition wires as supplied by the manufacturers. The high voltage probe is designed to measure voltages up to 50,000 volts and produce an output of up to 10 volts using the 5,000 to 1 attenuation making the probe output compatible with low voltage integrated circuitry. The total loading capacitance of the probe as seen by the ignition system is less than 5 picofarads which is under the maximum load capacitance of 10 picofarads as specified by the Society of Automotive Engineers high voltage measurement standards.

An alternative version of the capacitive clamp-on probe which opens and closes to admit the ignition wire is shown in detail in FIGS. 6 and 7. The probe consists of two hinged semicircular jaw-like portions 70 and 72 which, when in the closed position shown in FIG. 6, will center the ignition wire 17 automatically in a self-centering groove 82 at the center of each semicircular portion 70 and 72. In its electrical operation the probe of FIG. 6 is similar to the three plate probe described in conjunction with FIGS. 1-5 in that it contains an outer plate 74 composed of a metallic substance such as steel or aluminum and two narrow inner foils 76 and 78 of aluminum or copper. The foils are separated by insulating material 77 and 79 as described previously (FIG. 7).

A plastic semicircular member 80 having a low dielectric constant such as diallyl thalate is located inside each of the semicircular probe halves 70 and 72 in order to support the ignition wire. The dielectric members 80 contain a diamond shaped self-centering groove 82 at the center thereof which serves to repeatably maintain the ignition wire in the same axial position. The semicircular dielectric member 80 in each of the semicircular halves also contains a wire stop finger 84 extending therefrom which mates into a hole 85 contained in the opposite dielectric member and which prevents the ignition wire from being inserted into the probe in a position past the self-centering groove 82.

An extension 86 of the outer metallic plate 74 forms a hinge connection between the two semicircular halves of the voltage probe. A hinge pin 88 serves to join the plate extensions 86 and also serves as a support for a spring 90 (FIG. 6) which applies tension to close the jaws of the high voltage probe on the ignition wire. The wire is securely held within the self-centering grooves 82 when the jaws of the probe are closed.

A thumb lever 92 which is preferably made from the same metal as the outer plate 74 and which may also be coated with insulation is attached to the outer plate 74 and serves to allow the jaws of the voltage probe to be opened against the tension of spring 90 so that the ignition wire may be inserted therein.

The improved usability of the probe described in FIGS. 6 and 7 is a result of the use of the self-centering groove 82 which will fit multiple sizes of ignition wire. In addition, because of its unique construction including the self-centering groove 82 and the wire stop fingers 84, the ignition wire will always be positioned at the exact center of the probe allowing repeatability of measurement. The probe construction is adaptable to accept wires of 6 mm. to 9 mm. diameter and is not limited to 7 mm. diameter ignition wires. In its electrical operation and the connection of the shielded pair transmission wire it is identical to the embodiment shown in FIGS. 1-5.

Due to the air gaps which occur between the ignition wire 17 and the dielectric members 80 in both halves 70 and 72 of the clamp-on probe of FIGS. 6 and 7, the air gaps resulting from the essentially diamond-shaped cutout design of the selfcentering grooves 82, voltage breakdown may occur in the air gaps at potentials above 20 kv. Below this voltage, voltage measurements of a constant voltage level ignition pulse may be made to an accuracy of ±.01 kv. For measurement of high voltage ignition systems contained in some vehicles, it is desirable to modify the design of the probe of FIGS. 6 and 7 to eliminate the possibility of air gap breakdown.

As shown in FIG. 8, the semicircular probe head halves 70 and 72 are modified so that the dielectric members 80 contain a circular cutout 94 rather than a diamond shaped groove 82 as in FIGS. 6 and 7. So that the probe will be able to fit ignition wires between 5 mm. and 9 mm., the circular cutout 94 is preferably 0.412 inch diameter. A semicircular closed pore compressible rubber sheeting 96 approximately 0.125 in. thick is epoxied to the dielectric member 80 in each half 70 and 72 of the probe head so that the ignition wire may be inserted in the center of the rubber sheeting 96 when the probe is opened. Upon closing, the ignition wire will be held securely by the rubber sheeting 96, and air gaps in the immediate area of the point of contact between the probe and the ignition wire will be minimized. With the modification of FIG. 8, measurements to an accuracy of ±.01 kv can be made at voltages in excess of 30 kv.

While the voltage probe has been described in connection with a preferred embodiment thereof, it will be apparent that changes may be made in its construction without departing from the scope of the invention as hereinafter claimed.

Having thus described a typical embodiment of my invention, that which I claim as new and desire to secure by Letters Patent of the United States is:

1. A probe adapted to be clamped about an insulated conducting wire for measuring the potential of said wire comprising:

a first thin cylindrical plate of conductive material adapted to substantially surround said insulated wire, said first plate being separated from said insulated wire by a medium having a low dielectric constant, said first plate having a radius which is at least four times the radius of said insulated wire and an axial length much smaller than that of the portion of said insulated wire positioned within said probe so that the capacitance between said first plate and said wire is no more than one third the characteristic capacitance of said wire to minimize the effects of variations in the characteristics of said insulated wire;

a second thin cylindrical plate of conductive material concentrically surrounding said first plate and insulated therefrom, said second plate being spaced a very short distance from said first plate relative to the distance between said insulated wire and said first plate and shielding said first plate from external fields;

clamping means including a longitudinally extending discontinuity in the circumference of said first and second conducting plates for admitting and securely positioning said wire substantially coaxially within said first and second plates without disconnecting said wire, said clamping means restricting motion of said wire within said probe; and a transmission cable including a pair of electrical conductors respectively connected to said first plate and to said second plate.

2. A probe according to claim 1 in which said second conducting plate extends beyond the ends of said first conducting plate along the longitudinal axis defined by said insulated wire.

* * * * *